United States Patent
Sandhu et al.

(10) Patent No.: US 6,555,432 B2
(45) Date of Patent: Apr. 29, 2003

(54) INTEGRATED CAPACITOR BOTTOM ELECTRODE FOR USE WITH CONFORMAL DIELECTRIC

(75) Inventors: Gurtej S. Sandhu, Boise, ID (US); J. Brett Rolfson, Boise, ID (US)

(73) Assignee: Micron Technology, Inc., Boise, ID (US)

(*) Notice: Subject to any disclaimer, the term of this patent is extended or adjusted under 35 U.S.C. 154(b) by 137 days.

(21) Appl. No.: 09/733,820

(22) Filed: Dec. 8, 2000

(65) Prior Publication Data
US 2001/0001257 A1 May 17, 2001

Related U.S. Application Data

(60) Continuation of application No. 08/964,946, filed on Nov. 5, 1997, now Pat. No. 6,211,033, which is a division of application No. 08/589,899, filed on Jan. 23, 1996, now Pat. No. 5,754,390.

(51) Int. Cl.$^7$ .................. H01L 21/8242; H01L 21/20
(52) U.S. Cl. .................. 438/253; 438/244; 438/255; 438/387; 438/396; 438/398
(58) Field of Search .................. 438/398, 396, 438/387, 255, 253, 244

(56) References Cited

U.S. PATENT DOCUMENTS

| | | | |
|---|---|---|---|
| 5,006,481 A | 4/1991 | Chan et al. | 438/253 |
| 5,037,773 A | 8/1991 | Lee et al. | 438/255 |
| 5,057,447 A * | 10/1991 | Paterson | 438/253 |
| 5,116,776 A * | 5/1992 | Chan et al. | 438/396 |
| 5,138,411 A | 8/1992 | Sandhu | 257/296 |
| 5,182,232 A | 1/1993 | Chhabra et al. | 438/398 |
| 5,240,872 A * | 8/1993 | Motonami et al. | 438/253 |
| 5,278,091 A | 1/1994 | Fazan et al. | 438/398 |
| 5,305,256 A * | 4/1994 | Tanigawa | 257/306 |
| 5,387,531 A * | 2/1995 | Rha et al. | 439/397 |
| 5,418,180 A | 5/1995 | Brown | 438/398 |
| 5,429,972 A | 7/1995 | Anjum et al. | 438/398 |
| 5,442,213 A * | 8/1995 | Okudaira et al. | 257/310 |
| 5,444,013 A | 8/1995 | Akram et al. | 438/398 |
| 5,486,488 A * | 1/1996 | Kamiyama | 438/396 |
| 5,506,166 A | 4/1996 | Sandhu et al. | 438/396 |
| 5,566,045 A | 10/1996 | Summerfelt et al. | 361/321.1 |
| 5,597,754 A * | 1/1997 | Lou et al. | 438/398 |
| 5,663,088 A | 9/1997 | Sandhu et al. | 438/396 |
| 5,677,226 A | 10/1997 | Ishitani | 438/3 |
| 5,693,553 A * | 12/1997 | Kashihara et al. | 438/240 |
| 5,696,017 A | 12/1997 | Ueno | 438/253 |
| 5,717,250 A | 2/1998 | Schuele | 257/754 |
| 5,731,235 A | 3/1998 | Srinivasan et al. | 438/253 |
| 5,939,333 A | 8/1999 | Hurley et al. | 438/791 |

OTHER PUBLICATIONS

H. Watanabe et al., "Hemispherical Grainer Si Formation on in situ Phosporus Doped Amorphous Si Electrode for 256Mb DRAM's Capacitor," IEEE Transactions on Electron Devices, vol. 42, No. 7, pp. 1247–1254, Jul. 1995.
"Silicon Processing for the VLSI Era," Wolfe, vol. II, pp. 212–214.

* cited by examiner

Primary Examiner—Matthew Smith
Assistant Examiner—Lex H. Malsawma
(74) Attorney, Agent, or Firm—Knobbe, Martens, Olson & Bear LLP

(57) ABSTRACT

Disclosed is a capacitor construction for a more uniformly thick capacitor dielectric layer, and a method for fabricating the same. The method has special utility where the bottom electrode comprises composite layers over which the capacitor dielectric demonstrates differential growth during deposition. Exposed portions of an underlying first electrode layer, are covered either by a conductive or dielectric spacer, or by a dielectric padding. For the preferred embodiments, in which the bottom electrode comprises titanium carbonitride over rough polysilicon, a dielectric padding may be formed during a rapid thermal nitridation step, which causes silicon nitride to grow out of an exposed polysilicon sidewall. Alternatively, a sidewall spacer may be formed by deposition an additional layer of titanium nitride over the original titanim nitride strap, and performing a spacer etch.

35 Claims, 4 Drawing Sheets

INTEGRATED CAPACITOR BOTTOM ELECTRODE FOR USE WITH CONFORMAL DIELECTRIC

REFERENCE TO RELATED APPLICATION

The present application is a continuation of U.S. application Ser. No. 08/964,946, filed Nov. 5, 1997, now U.S. Pat. No. 6,211,033 which is a divisional of U.S. application Ser. No. 08/589,899, filed Jan. 23, 1996, issued on May 19, 1998 as U.S. Pat. No. 5,754,390.

FIELD OF THE INVENTION

The present invention relates to capacitor designs for integrated circuits, and more particularly to the fabrication of capacitor bottom electrodes for high performance dynamic random access memory (DRAM) chips.

BACKGROUND OF THE INVENTION

Recent advances in the miniaturization of integrated circuits have led to smaller chip areas available for devices. High density dynamic random access memory chips (DRAMs), for example, leave little room for the storage node of a memory cell. Yet, the storage node (capacitor) must be able to store a certain minimum charge, determined by design and operational parameters, to ensure reliable operation of the memory cell. It is thus increasingly important that capacitors achieve a high stored charge per unit of chip area occupied.

Traditionally, capacitors integrated into memory cells have been patterned after the parallel plate capacitor. A layer of dielectric is deposited between the deposition of two conductive layers and the layers are patterned, either sequentially during deposition or all at once. The patterned dielectric layer becomes the capacitor dielectric while the patterned conductive layers become the top and bottom plates or electrodes of the resultant capacitor structure. The amount of charge stored on the capacitor is proportional to the capacitance, $C = \epsilon\epsilon_0 A/d$, where $\epsilon$ is the dielectric constant of the capacitor dielectric, $\epsilon_0$ is the vacuum permittivity, A is the electrode area and d is the spacing between electrodes.

Several techniques have recently been developed to increase the total charge capacity of the cell capacitor without significantly affecting the chip area occupied by the cell. These include increasing the effective surface area (A) of the electrodes by creating folding structures, such as trench or stacked capacitors. Such structures better utilize the available chip area by creating three dimensional shapes to which the conductive electrodes and interlayer dielectric conform.

FIG. 1 illustrates one commonly used method of increasing cell capacitance through further increasing the surface area of the capacitor electrodes, by providing a roughened or texturized electrode surface. Roughened polycrystalline silicon (polysilicon, or simply poly) in the form of hemispherical grained silicon (HSG silicon or HSG polysilicon), for example, has been implemented for a bottom (or storage) electrode 10 of the capacitor, contacting an active area 12 of a silicon substrate 14. A thin dielectric 16 and a top (or reference) electrode layer 18 are then added conformally over the rough surface of the bottom electrode, taking on similar roughness. The electrode area A, from the capacitance formula above, is thus effectively increased, increasing the capacitance of the memory cell.

As a bottom electrode for a capacitor, however, the roughened polysilicon should be doped for conductivity sufficient to allow the bottom plate 10 to hold the requisite amount of charge. Unfortunately, rough polysilicon deposition techniques, such as HSG vacuum annealing are most effective at lower doping levels. Further doping the silicon of the bottom plate 10 tends to result in diffusion of the dopants through the silicon bottom electrode 10 to the underlying active area 12. For example, phosphorus from solid source $P_2O_5$, a commonly employed dopant, diffuses easily through silicon during high temperature anneal steps. Downwardly diffused dopants interfere with junction operation by changing the dopant profile of the active area and the transistor characteristics. Although implanted dopants, such as arsenic ions, diffuse less easily, they fail to dope vertical surfaces, are more expensive, and at any rate do not entirely eliminate the diffusion problem.

An additional problem with the structure of FIG. 1 stems from the presence of exposed crystalline triple points at the surface of the polysilicon bottom plate 10. A triple point occurs at the point at which three individual crystals join. Such heavy stress locations tend to cause cracking in the overlying dielectric layer, resulting in another source of leakage paths. To avoid the problem of cracking, a thicker dielectric layer should be deposited, but this lowers the capacitance of the cell by effectively increasing the electrode spacing d of the capacitance formula set forth above.

Prior art methods to increase cell capacity also include the use of new dielectric materials characterized by effectively higher dielectric constants ($\epsilon$), such as barium strontium titanate (BST), lead zirconate titanate (PZT), strontium bismuth tantalate (SBT), and various other ferro-electric materials. However, these materials are expensive and technical difficulties have been encountered in incorporating them into current integrated circuits with conventional fabrication techniques.

For example, chemical vapor deposition (CVD) of PZT and BST is often accompanied by oxidation of polysilicon electrodes. These new dielectric materials themselves demonstrate chemical and physical instability under a variety of conditions common in current integrated circuit processing. For example, high temperature processes and plasma processes are known to degrade certain high-$\epsilon$ and ferro-electric materials. Very few techniques are therefore available for etching these materials without breaking down the dielectric layer and causing shorts. The problems with these materials have thus far prevented their use in large scale, commercial production of integrated circuits such as DRAMs or SRAMs. Furthermore, even when adequate solutions are developed to allow incorporation of high-dielectric materials, it will still be desirable to further enhance capacitance through use of roughened layers and consequent increased electrode surface area.

Therefore, a need exists for a process for incorporating conventional capacitor materials (such as polysilicon and $Si_3N_4$) into future generation integrated circuits, while at the same time providing adequate capacitance and avoiding the problems associated with doping the bottom plate.

SUMMARY OF THE INVENTION

According to one aspect of the invention, a method is provided for forming a capacitor dielectric of substantially uniform thickness over a composite bottom electrode. The composite bottom electrode comprises a first electrode layer and a conductive strap which only partially covers the first electrode layer.

According to another aspect of the invention, a method is provided for forming a layer of silicon nitride over a composite polysilicon and titanium carbonitride bottom electrode. After a polysilicon layer has been formed, a titanium carbonitride layer is formed superjacent the polysilicon layer. The bottom electrode is then defined by etching through both the titanium carbonitride layer and the polysilicon layer, thus leaving an exposed polysilicon sidewall. Prior to depositing the silicon nitride, the polysilicon sidewall of the bottom electrode is covered.

According to yet another aspect of the present invention, a capacitor bottom electrode and capacitor dielectric layer are provided for an integrated circuit. The bottom electrode comprises a first electrode layer and an overlying conductive strap. The first electrode layer is partially covered by an overlying conductive strap and partially covered by another covering. The capacitor dielectric is superjacent and substantially conformal over the conductive strap and the other covering.

DETAILED DESCRIPTION OF THE PREFERRED EMBODIMENT

Although the present description focuses on the context of a DRAM cell, it will be understood that the present invention may have utility in many integrated circuit applications wherein dielectric layers are desired over conductive layers, and especially over polysilicon layers. Such applications include, but are not limited to, integrated capacitors.

Figure 2:
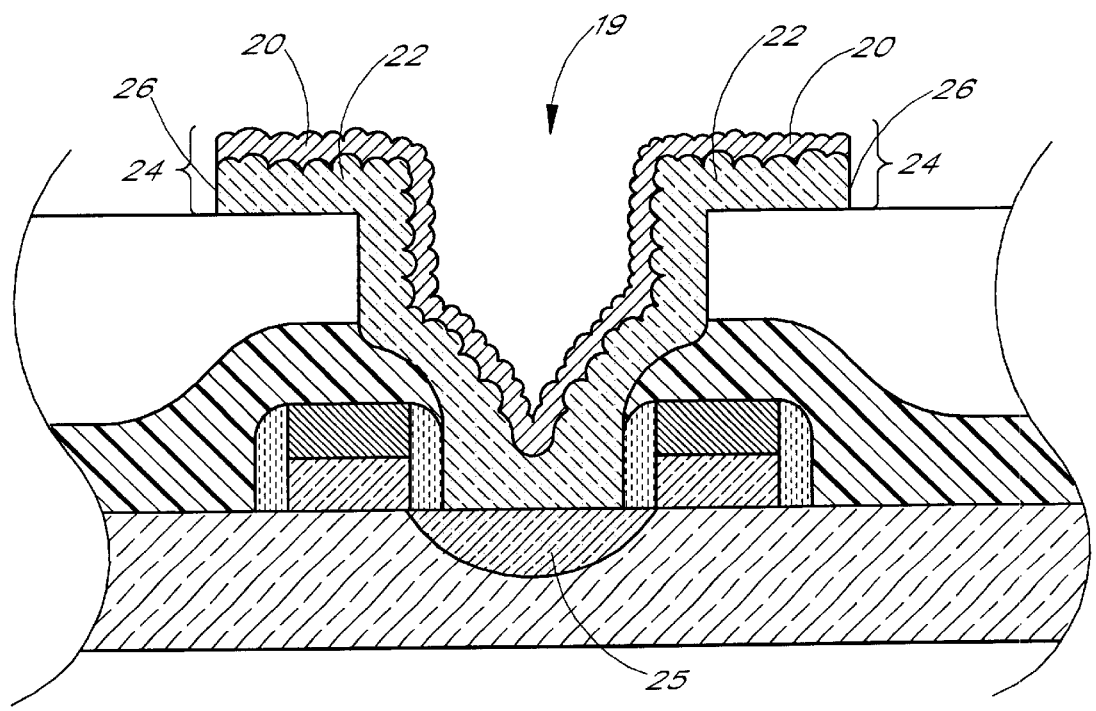
FIG. 2 is a schematic sectional view of a partially fabricated integrated circuit, representing a starting point for the present invention.

As mentioned in the "Background" section above, prior art capacitors entail many difficulties which may reduce reliability of the memory devices incorporating these capacitors. Accordingly, an alternate capacitor design may employ a conductive strap over a rough silicon layer. FIG. 2 illustrates a partially fabricated memory cell capacitor 19 including such a conductive strap 20 over a first electrode layer 22, together forming a bottom electrode 24. FIG. 2 represents a processing stage for the preferred embodiments of the present invention.

In the embodiments described herein, the first electrode layer 22 comprises a polysilicon layer in contact with a transistor active area 25, in a contact via, trench, or container, as will be understood by those skilled in the art of memory device fabrication. It will be understood, in view of the discussion to follow, that the first conductive layer 22 need not be roughened, and that, at any rate, other materials may form a roughened surface for use in the bottom electrode 22. See, for example, U.S. Pat. No. 5,182,232, issued Jan. 26, 1993 to Chhabra et al., and assigned to the assignee of the present invention, describing a method of texturizing metal silicide.

The first electrode layer 22 of the preferred embodiements, however, has a roughened surface in the form of hemispherical grained silicon (HSG polysilicon), which may be achieved by any known method. For example, rough polysilicon may be directly formed by low pressure chemical vapor deposition (LPCVD) at approximately 560° C. Another possible process includes depositing an amorphous silicon film at about 550° C., followed by a high temperature transformation anneal causing surface migration to form polycrystalline silicon grains. The polysilicon may be phosphorus doped with an intermediate dosage of $10^{18}$–$10^{19}$ atoms/cm$^3$ for enhanced conductivity. Typical thicknesses for this layer 22 are between 200 Å and 1,000 Å, most preferably about 500 Å for the present invention. Note that the electrode and dielectric layer thicknesses are exaggerated for illustrative purposes, and not drawn to scale.

Figure 1:
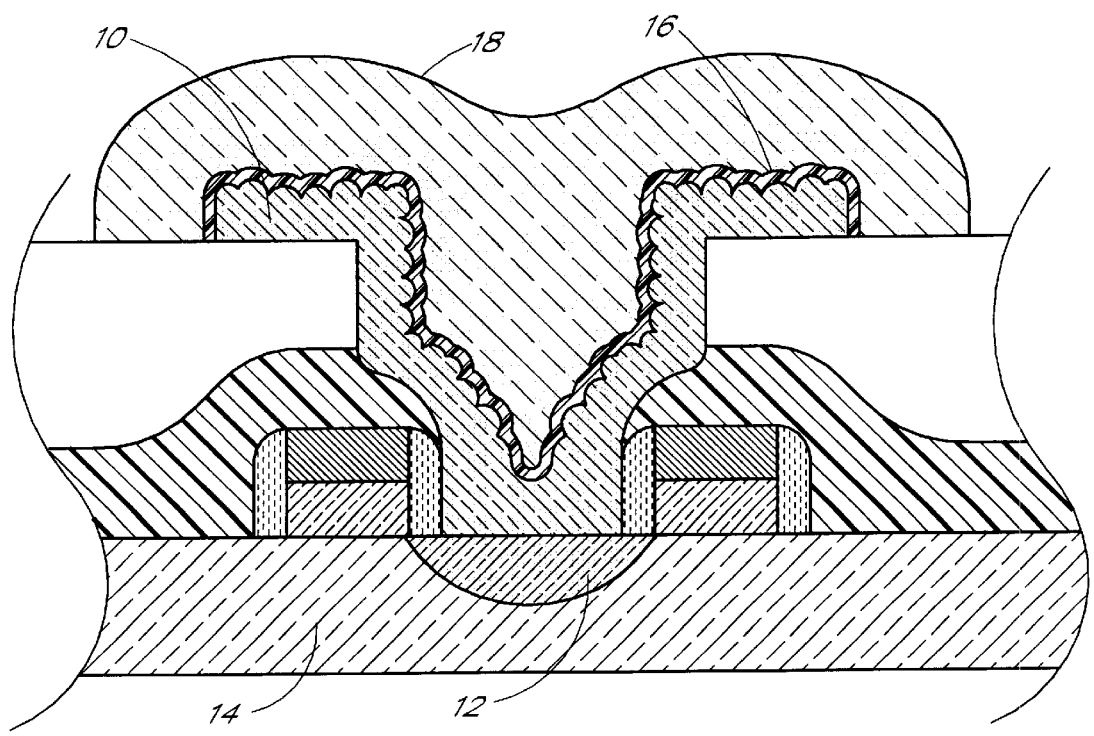
FIG. 1 is a schematic sectional view of a partially fabricated integrated circuit, illustrating a prior art capacitor design.

The strap 20 improves the overall bottom electrode conductivity, such that the polysilicon of the first electrode layer 22 need not be doped as heavily as prior art HSG polysilicon 10 (FIG. 1) would require. The lighter dopant dosage alleviates downward diffusion, thus reducing the accompanying current leakage and junction interference. At the same time, the the roughness of the first electrode layer 22 is transferred to the overlying, thin and conformal conductive strap.

The conductive strap 20 is then deposited over the polysilicon layer 22. Together, the strap 20 and poly layer 22 are etched through (using a single, conventional photolithographic mask) to define the bottom electrode 24 for this memory cell, while leaving an exposed polysilicon sidewall 26. The conductive strap 20 preferably comprises an amorphous layer of conductive material. For example, a titanium nitride, most preferably titanium carbonitride from a metal organic precursor, is used for the strap, as described in the copending U.S. patent application of Sandhu et al., entitled "Method Of Forming Capacitors And Capacitor Construction," Ser. No. 08/444,852, filed May 19, 1995, assigned to the assignee of the present invention, the disclosure of which is hereby incorporated by reference. In addition to increasing the conductivity of the bottom electrode 24, titanium carbonitride as the conductive strap 20 also acts as a diffusion barrier to any outward diffusion and prevents stress at polysilicon triple points from causing cracking in the dielectric layer, due largely to the amorphous nature of titanium carbonitride.

Although not particular to the present invention, the preferred method of forming the conductive strap 20 is by metal organic chemical vapor deposition (MOCVD), wherein the metal organic precursor most preferably comprises tetrakisdimethyl-amidotitanium (TDMAT) while the carrier gas is nitrogen ($N_2$). Preferred parameters for the MOCVD deposition include temperatures between about 300° C. and 400° C., and pressures between about 10 mTorr and 100 Torr, most preferably at about 420° C. and 0.5 Torr. Alternative methods of forming the conductive strap 20 include TiN CVD with $TiCl_4$ as the titanium source and $NH_3$ as the nitrogen source, or Ti deposition followed by a thermal nitrogen anneal to convert the titanium to TiN. Hereinafter, "TiN" shall refer to any titanium nitride material, including the titanium carbonitride of the preferred conductive strap 20.

A thin titanium carbonitride layer, between about 50 Å and 500 Å, more preferably between about 150 Å and 250 Å, and most preferably about 200 Å, should be deposited, thus forming the conductive strap 20 which, in turn, forms part of the bottom electrode 24. The preferred MOCVD method, however, may produce undesirable levels of impurities within the film, particularly carbon in the form of TiC. Methods of reducing the carbon content of such MOCVD films are disclosed in the copending U.S. patent application of Sandhu, entitled "Method Of Reducing Carbon Incorporation Into Films Produced By Chemical Vapor Deposition Involving Organic Precursor Compounds," Ser. No. 08/336, 260, filed Nov. 8, 1994, assigned to the assignee of the present application, the disclosure of which application is hereby incorporated by reference.

A dielectric layer should then be deposited over the bottom electrode 24 for the capacitor inter-electrode dielectric. Silicon nitride is preferred for the capacitor dielectric due to its stability, ease of incorporation into conventional fabrication processes, and relatively high dielectric constant (approximately twice that of silicon dioxide). Silicon nitride also tends to form a good diffusion barrier, impervious to water, sodium, and even oxygen. Furthermore, chemical vapor deposition (CVD) of silicon nitride ($Si_3N_4$) is well-studied, and may provide for conformal, pure, stoichiometric films of $Si_3N_4$. Various CVD methods of depositing $Si_3N_4$ are discussed in Wolf and Tauber, "Silicon Processing for the VLSI Era: Vol. 1—Process Technology" (Lattice Press 1988), pp. 191–94, the discussion of which is hereby incorporated by reference.

Figure 3:
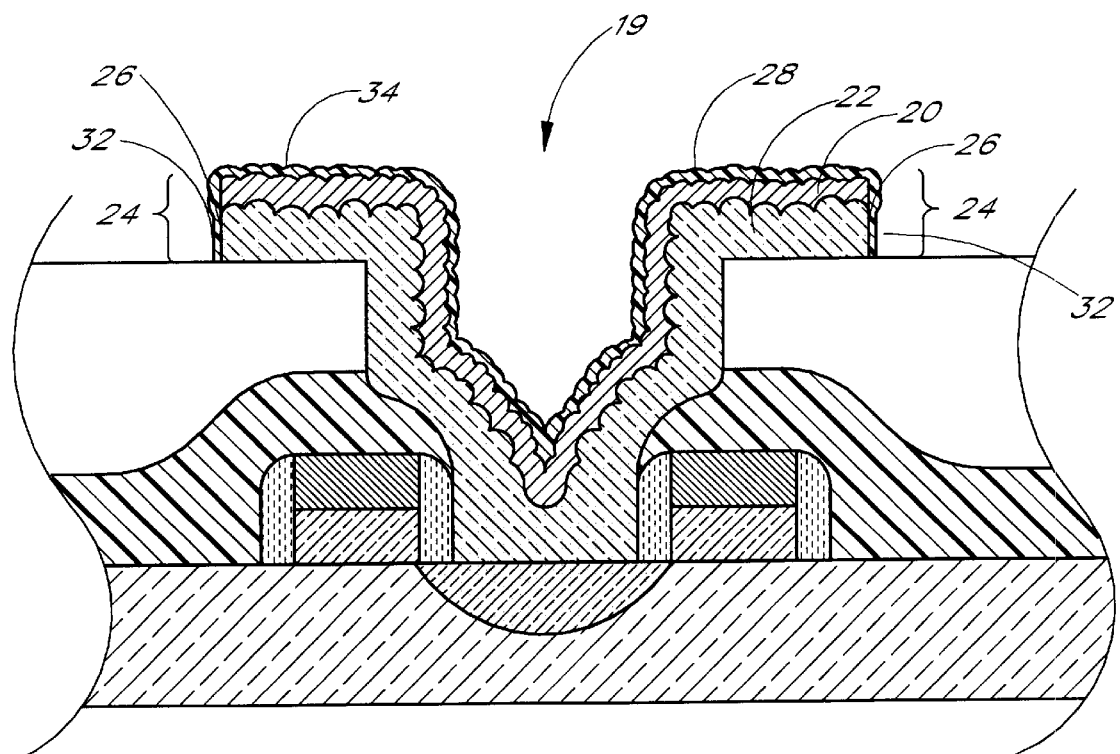
FIG. 3 illustrates a dielectric layer deposited over the bottom electrode of FIG. 2.

FIG. 3 illustrates an irregular dielectric layer 28 that would be formed by depositing the dielectric layer 28 immediately after formation of the bottom electrode 24 of FIG. 2. CVD $Si_3N_4$, it is recognized, grows very well on amorphous films such as the conductive strap 20 of FIG. 2, due to a lack of localized nucleation centers on the strap 20 surface. In fact, $Si_3N_4$ grows more than twice as fast on titanium carbonitride as it does on polysilicon. Direct dielectric deposition over the bottom electrode 24 of FIG. 2, with disparate growth rates over the conductive strap 20 and the polysilicon sidewalls 26, would therefore result in the dielectric layer 28 of uneven thickness shown in FIG. 3. Again, layer thicknesses are exaggerated in the drawings for ease of illustration.

A thin portion 32 of the dielectric, grown over the exposed polysilicon sidewalls 26, must not be so thin as to allow punchthrough leakage currents which would lead to device failure. Thus, deposition would have to continue until the thin portion 32 is of a minimal thickness (e.g., about 50–70 Å) to avoid punchthrough. By this point in the deposition, however, a thick portion 34 of the dielectric, grown over the conductive strap 20, would be more than twice the optimal thickness for capacitor dielectrics. The structure of FIG. 3 thus produces a relatively large value for the interelectrode spacing d from the capacitance formula set forth in the "Background" section above, reducing capacitance relative to capacitors incorporating more conformal dielectric layers.

While still incorporating silicon nitride and its accompanying advantages, the preferred embodiments of the present invention (FIGS. 4–8), introduce an additional advantage over the structure of FIG. 3. By providing a more closely conformal dielectric layer 45 (FIG. 5) or 55 (FIG. 8) over the bottom electrode 24 than the dielectric layer 28 of FIG. 3, the present invention increases cell capacitance per cell volume as compared to the capacitor of FIG. 3. Rather than directly depositing the $Si_3N_4$ over the structure of FIG. 2, the preferred embodiments of the present invention employ intermediate method steps and structures prior to dielectric deposition.

Figure 4:
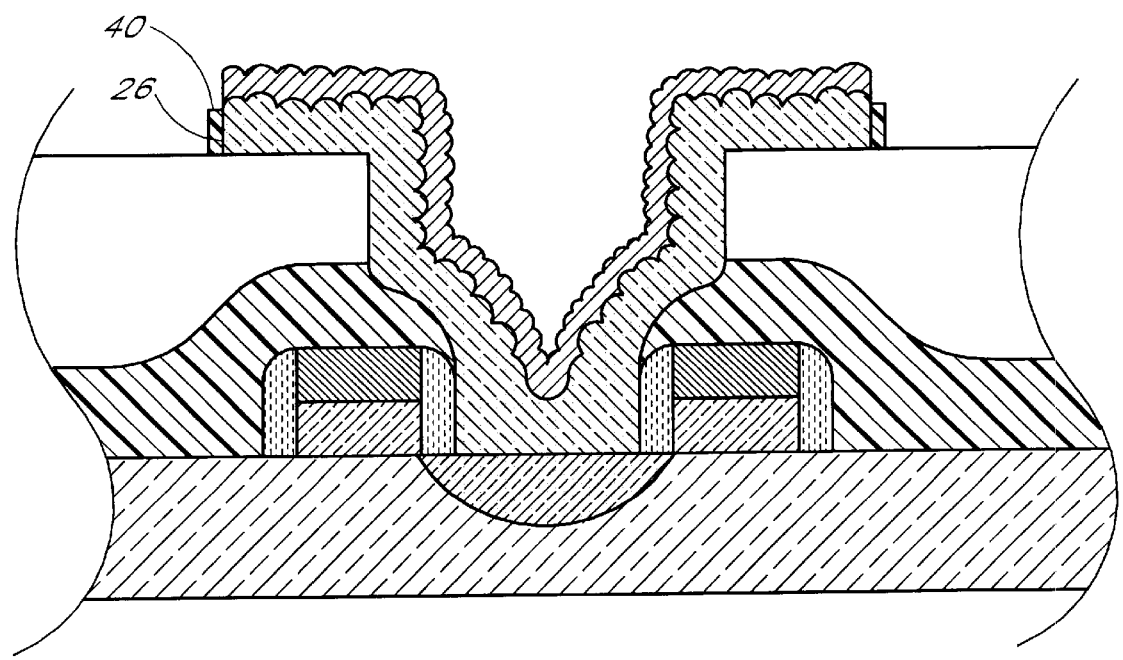
FIGS. 4–5 illustrate generally the fabrication of an integrated capacitor in accordance with a first preferred embodiment of the present invention.

FIG. 4, for example, illustrates an intermediate structure of a first preferred embodiment of the present invention. After the bottom electrode 24 has been formed and patterned, as described above (see FIG. 2), a standard resist strip and dilute HF dip (100:1 HF) is performed prior to placing the wafer in a chamber or furnace. Most preferably, a rapid thermal CVD (RTCVD) tool is used, wherein a rapid thermal nitridation (RTN) step is performed in $N_2$ or $NH_3$ ambient. As a result of the RTN, an initial layer of nitride padding 40, comprising $Si_3N_4$ for the first preferred embodiment, grows out of the polysilicon of the first electrode layer 22 at the exposed sidewall 26. The RTN step of the first preferred embodiment should be performed after the bottom electrode 24 is patterned, and takes place in a predominantly nitrogen environment ($N_2$ or $NH_3$) between about 800° C. and 1,100° C., most preferably at about 1,000° C., for between about 5 sec and 60 sec, most preferably for about 20 sec. The RTN results in the nitride padding 40, having a thickness between 10 Å and 50 Å, most preferably about 30 Å.

Transfer from the etch chamber to the RTN chamber should not be problematic, since any native oxide would be substantially cleaned by the dilute HF dip. Residual oxide would add only slightly to the thickness of the dielectric layer formed by the RTN, and the growth of the silicon nitride would at any rate break up the native oxide. Optionally, an in-situ HF clean may be performed prior to the RTN step.

The RTN may demonstrate additional advantages by improving the density of the conductive strap 20. Any residual reactants in the conductive strap 20, as deposited, may combine to form stable TiN and TiC compounds. Especially where a titanium-rich material has been deposited, the nitrogen environment during the RTN aids in converting any excess Ti to TiN, for example. Even where the correct proportions of Ti and N are present in the deposited film, high temperatures during the RTN aid in combining unreacted Ti and N. Furthermore, high temperature steps tend to cause impurities within the conductive strap 20 to diffuse outward.

Figure 5:
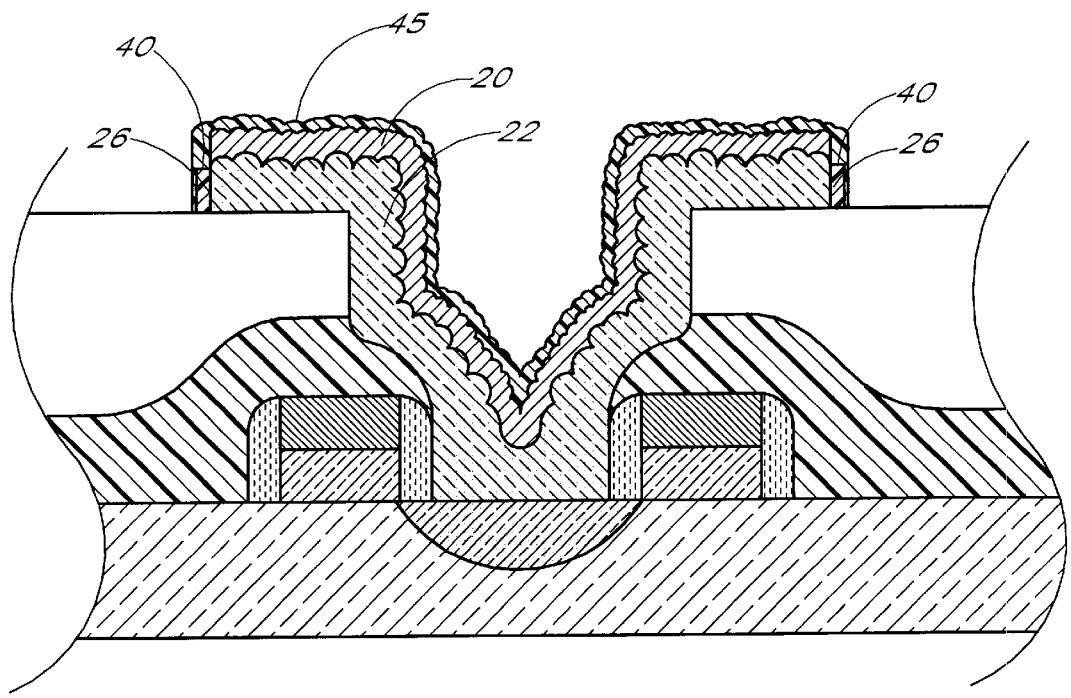

FIG. 5 illustrates the integrated circuit after a dielectric layer 45 has been deposited, preferably by known CVD techniques, over the capacitor bottom plate 24 and the nitride padding 40 formed by the RTN. In accordance with the first preferred embodiment, the dielectric layer 45 comprises a layer of silicon nitride of a thickness between approximately 50 Å and 70 Å over the conductive strap 20. Such a layer 45 is optimally thin for high capacitance, though thicker films may be tolerable, depending upon design and operational parameters for the memory circuit.

The preferred deposition is a low pressure process (LPCVD) conducted between about 600° C. and 900° C., most preferably at about 780° C., with pressures maintained between about 50 mTorr and 1,000 mTorr, most preferably at about 250 mTorr. The component chemicals for the preferred nitride deposition include dichlorosilane ($SiCl_2H_2$ or DCS) and ammonia ($NH_3$), with a $NH_3$:DCS volumetric ratio between about 3:1 and 10:1, most preferably about 5:1. Although chemical vapor deposition may still build the dielectric 45 more quickly over the conductive strap 20 than over the nitride padding 40, the $Si_3N_4$ of the grown padding 40 (30–50 Å for the first preferred embodiment) supplements the thickness of the deposited dielectric layer 45 over the polysilicon sidewall 26. Accordingly, risk of punchthrough current leakage at the sidewall 26 is reduced considerably.

Figure 6:
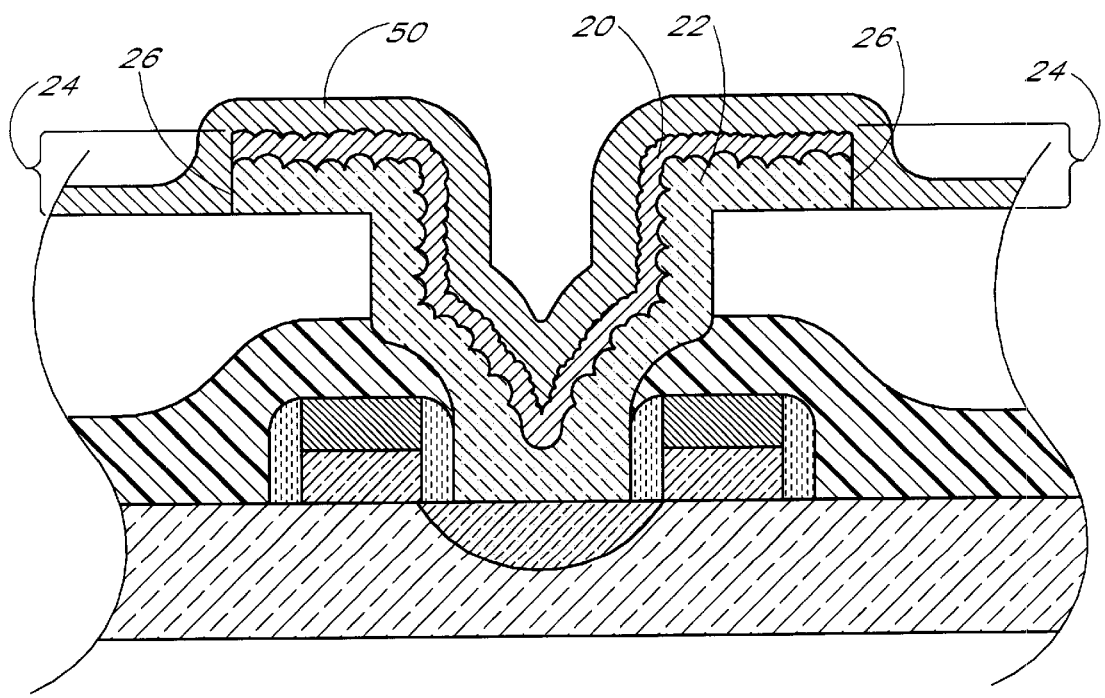
FIGS. 6–8 illustrate generally the method steps of a second preferred embodiment of the present invention.
Figure 7:
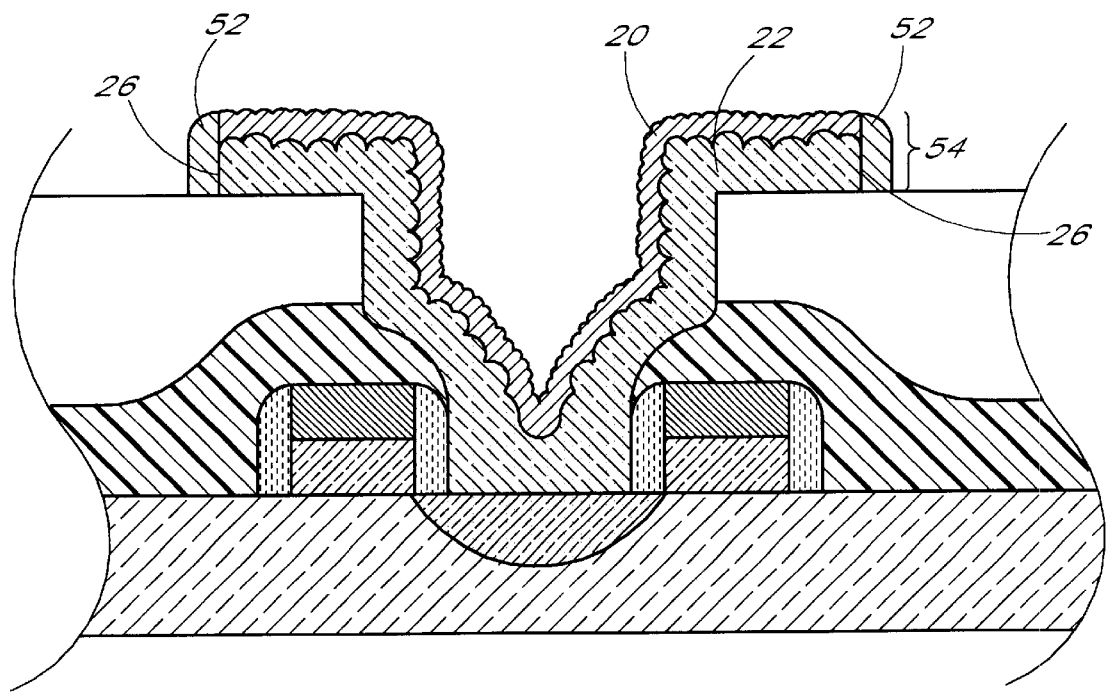
Figure 8:
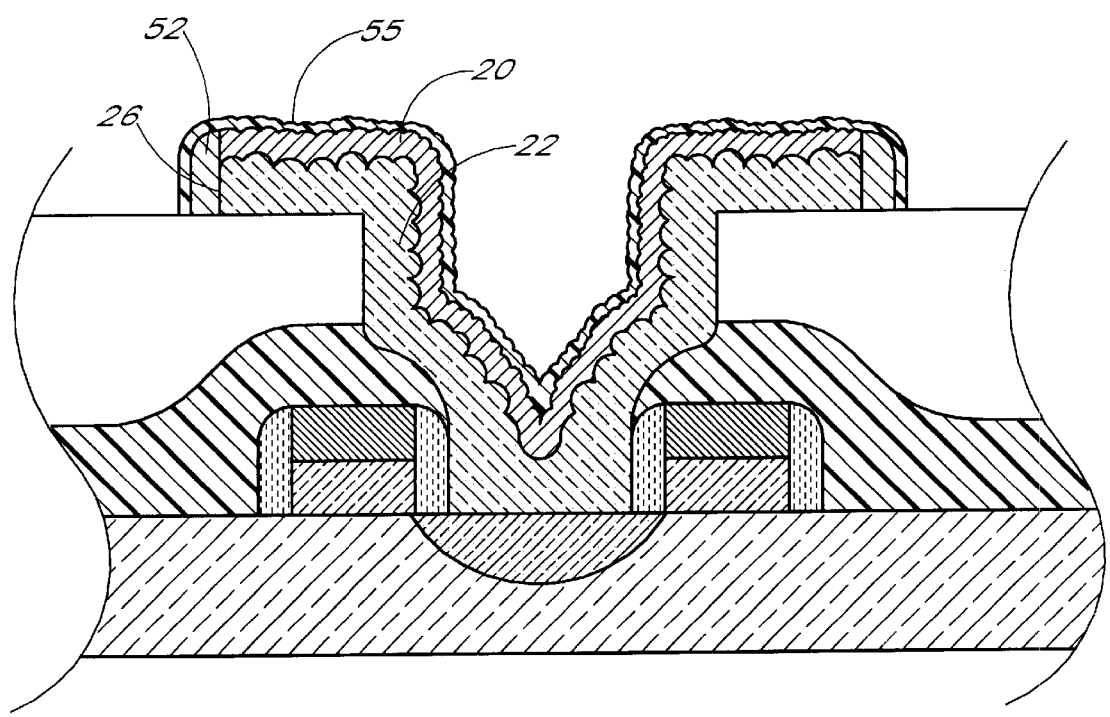

FIGS. 6–8 illustrate a second preferred embodiment, whereby the objects of the present invention may be achieved. As with the first preferred embodiment, FIG. 2 represents a processing stage for the second preferred embodiment, wherein the bottom electrode 24 has been formed as a composite of the first electrode layer 22 (preferably polysilicon) and the overlying conductive strap 20.

After the bottom electrode 24 has been formed and patterned, a second conductive layer 50 is formed over the bottom electrode 24, as illustrated in FIG. 6. The second conductive layer 50 is preferably comprised of the same conductive material which forms the strap 20, which for the preferred embodiment is MOCVD titanium carbonitride. The second conductive layer 50 should also be deposited to about the same thickness as the conductive strap 20 (i.e., most preferably about 200 Å).

A spacer etch is then performed, resulting in conductive sidewall spacers 52 forming over the polysilicon sidewalls 26, shown in FIG. 7. Spacer formation in general is known in the art of integrated circuit formation. For example, insulating spacers are often formed to insulate transistor gate structures, as described in Wolf, "Silicon Processing for the VLSI Era: Vol. 2—Process Integration" (Lattice Press, 1990), pp. 212–14. Steps in the circuit topography are conformally covered with the material from which the spacers are to be formed, and an anisotropic etch performed to expose the underlying structures. The vertical sidewalls formed by the steps remained covered with unetched portions, referred to as "spacers."

For the second preferred embodiment, the second conductive layer 50 (FIG. 6) comprises MOCVD TiN, to match the underlying TiN of the preferred conductive strap 20. Since the spacer etch is controlled to etch only the thickness of the second conductive layer 50 while leaving the conductive strap 20 unetched, the etch should be time-stopped (to etch only 200 Å TiN), and need not be selective. Preferably, the spacer comprises a plasma etch, such as a reactive ion etch (RIE) with chlorine- or fluorine-based reactants.

After the spacer etch, a bottom electrode 24 now comprises the first electrode layer 22 covered by the conductive strap 20 and the sidewall spacers 54, both of which comprise the same conductive material (specifically titanium carbonitride). Note that the thickness of the conductive strap 20 may actually be modified slightly by the TiN deposition and spacer etch, depending on conformality of the deposition and whether slight under- or over-etch is performed. Regardless of any thickness modification, the structure overlying the first electrode layer 22 of the second preferred embodiment, including the polysilicon sidewall 26, is titanium carnonitride.

The growth rate of CVD silicon nitride will be equal over both the strap 20 and the spacers 52. Chemical vapor deposition of silicon nitride may thus result in a very conformal, uniformly thick dielectric layer 55, as shown in FIG. 8. Parameters for this deposition may be exactly as described above with respect to the first preferred embodiment.

In a third preferred embodiment, the second conductive layer 50 of the second preferred embodiment (FIG. 6) may be replaced with a dielectric material. For example, a layer of $Si_3N_4$ may be deposited over the bottom electrode and a spacer etch performed. Although not illustrated, it will be understood that a dielectric sidewall spacer would result, in place of the conductive sidewall spacer 52 of the second embodiment. Just as the nitride padding 40 of the first preferred embodiment (FIGS. 4–5) supplements the thickness of the deposited capacitor dielectric, so may the dielectric sidewall spacer of the third preferred embodiment supplements the capacitor dielectric thickness.

The present invention thus allows the use of an amorphous, conductive strap, such titanium carbonitride, over a first electrode layer, such as rough polysilicon, incorporating the many advantages of such a structure (e.g., greater conductivity, less doping required of the first electrode layer, less diffusion of any dopants which are used, reduced risk of pinholes in any overlying dielectric layer, etc.). At the same time, the present invention allows deposition over this structure of a relatively conformal dielectric layer comprised of conventional dielectric materials, such as silicon nitride. The greater dielectric conformality afforded by this invention may, for instance, enable the use of thinner dielectric layers without unduly risking punchthrough leakage, decreasing the overall volume occupied by a capacitor dielectric. This, in turn, increases the overall capacitance per unit of chip area without the use of expensive and unstable high-dielectric materials. Conventional dielectric materials may therefore continue to be used in future generations of memory chips.

Although the foregoing invention has been described in terms of certain preferred embodiments, other embodiments will become apparent to those of ordinary skill in the art, in view of the disclosure herein. For example, other embodiments may include the use a separate mask for patterning a conductive strap over an underlying conductive layer (including, but not limited to, rough polysilicon). Rough polysilicon may be formed and patterned using a photolithographic mask. The conductive layer may then be deposited over the prepatterned rough polysilicon and patterned through use of a second, larger mask which allows the polysilicon sidewalls to remain covered with the strap material (e.g., TiN) even after the patterning etch has been performed. Thereafter, conformal dielectric deposition may proceed as with the second preferred embodiment.

Furthermore, the preferred embodiments concentrate on the use of composite rough polysilicon and titanium carbonitride bottom electrodes for integrated capacitors. It will be understood, however, that the bottom electrode is not limited to these particular materials, and that the present invention will have application in many circumstances where conformal layers are desired over composite layers in integrated circuit fabrication. Accordingly, the present invention is not intended to be limited by the recitation of preferred embodiments, but is instead intended to be defined solely by reference to the appended claims.

We claim:

1. A method of forming an integrated circuit, including a capacitor, the method comprising:

forming a composite capacitor bottom electrode comprised of a first electrode layer and an overlying conductive strap, the conductive strap only partially covering the first electrode layer to define strapped and exposed portions of the first electrode layer;

treating the exposed portions of the first electrode layer to improve a rate of deposition of a capacitor dielectric thereover; and forming the capacitor dielectric layer of a substantially uniform thickness over both the conductive strap and the exposed portions of the first electrode layer of the composite capacitor bottom electrode.

2. The method of claim 1, wherein the dielectric layer comprises a layer of silicon nitride.

3. The method of claim 2, wherein forming the dielectric layer comprises chemical vapor deposition of the silicon nitride.

4. The method of claim 3, wherein the chemical vapor deposition comprises a low pressure deposition flowing dichlorosilane and ammonia at a temperature between about 600° C. and 900° C. and a pressure between about 50 mTorr and 1,000 mTorr.

5. The method of claim 1, wherein the conductive strap comprises a material over which the dielectric grows during deposition at differential rates compared to growth over the first electrode layer.

6. The method of claim 5, wherein the conductive strap comprises a material over which the dielectric grows more quickly during deposition than the dielectric grows over the first electrode layer.

7. The method of claim 5, wherein the first electrode layer comprises a crystalline layer and the conductive strap comprises an amorphous conductive layer.

8. The method of claim 5, wherein the first electrode layer comprises silicon and the conductive strap comprises a metal nitride.

9. The method of claim 8, wherein the first electrode layer comprises a rough polysilicon layer and the conductive strap comprises a titanium carbonitride layer.

10. The method of claim 1, wherein treating comprises a nitridation of the first electrode layer.

11. The method of claim 1, wherein the exposed portions include an exposed first electrode layer sidewall, wherein treating comprises covering the exposed first electrode layer sidewall, further comprising depositing the dielectric layer over the bottom electrode, including over the covered first electrode layer sidewall, after covering the exposed first electrode layer sidewall.

12. The method of claim 11, wherein covering the exposed first electrode layer sidewall comprises forming a sidewall spacer over the exposed first electrode layer sidewall.

13. The method of claim 12, wherein forming the spacer comprises:
    depositing a layer of spacer material; and
    performing a spacer etch.

14. The method of claim 13, wherein the spacer material comprises a dielectric.

15. The method of claim 14, wherein the spacer material comprises the same material as the capacitor dielectric layer.

16. The method of claim 13, wherein the spacer material comprises the same material as the overlying conductive strap.

17. The method of claim 16, wherein the overlying conductive material and the spacer material comprise titanium carbonitride, and the spacer etch comprises a reactive ion etch.

18. The method of claim 17, wherein the reactive ion etch comprises a fluorine plasma etch.

19. The method of claim 11, wherein covering the exposed first electrode layer sidewall comprises forming a dielectric padding over the exposed first electrode layer sidewall.

20. The method of claim 17, wherein the dielectric padding comprises the same material as the dielectric layer to be deposited.

21. The method of claim 20, wherein the dielectric layer comprises a nitride, and the dielectric padding formation comprises a rapid thermal nitridation.

22. The method of claim 21, wherein the first electrode layer comprises a silicon layer and the dielectric padding comprises silicon nitride.

23. The method of claim 22, wherein the rapid thermal nitridation comprises heating the bottom electrode to a temperature between about 800° C. and 1,100° C. in a predominantly nitrogen environment for between about 5 seconds and 60 seconds.

24. A method of forming an integrated circuit, including a capacitor, the method comprising:
    forming a composite capacitor bottom electrode comprised of a first electrode layer and an overlying conductive strap, the conductive strap only partially covering the first electrode layer to define strapped and exposed portions of the first electrode layer; and
    forming a capacitor dielectric layer of a substantially uniform thickness over both the conductive strap and the exposed portions of the first electrode layer of the composite capacitor bottom electrode,
    wherein the conductive strap comprises a material over which the dielectric grows during deposition at differential rates compared to growth over the first electrode layer.

25. The method of claim 24, wherein the conductive strap comprises a material over which the dielectric grows more quickly during deposition than the dielectric grows over the first electrode layer.

26. The method of claim 25, wherein the first electrode layer comprises a crystalline layer and the conductive strap comprises an amorphous conductive layer.

27. The method of claim 24, wherein the first electrode layer comprises silicon and the conductive strap comprises a metal nitride.

28. The method of claim 27, wherein the first electrode layer comprises a rough polysilicon layer and the conductive strap comprises a titanium carbonitride layer.

29. A method of forming an integrated circuit, including a capacitor, the method comprising:
    forming a composite capacitor bottom electrode comprised of a first electrode layer and an overlying conductive strap, the conductive strap only partially covering the first electrode layer to define strapped and exposed portions of the first electrode layer, wherein the exposed portions include an exposed first electrode layer sidewall;
    covering the exposed first electrode layer sidewall, wherein covering the exposed first electrode layer sidewall comprises forming a sidewall spacer over the exposed first electrode layer sidewall, wherein forming the spacer comprises depositing a layer of the spacer material comprising the same material as the overlying conductive strap and performing a spacer etch; and
    forming a capacitor dielectric layer of a substantially uniform thickness over both the conductive strap and the exposed portions of the first electrode layer of the composite capacitor bottom electrode, wherein forming the dielectric layer comprises depositing the dielectric layer over the bottom electrode, including over the covered first electrode layer sidewall, after covering the exposed first electrode layer sidewall.

30. The method of claim 29, wherein the overlying conductive material and the spacer material comprise titanium carbonitride, and the spacer etch comprises a reactive ion etch.

31. The method of claim 30, wherein the reactive ion etch comprises a fluorine plasma etch.

32. A method of forming an integrated circuit, including a capacitor, the method comprising:
    forming a composite capacitor bottom electrode comprised of a first electrode layer and an overlying conductive strap, the conductive strap only partially covering the first electrode layer to define strapped and exposed portions of the first electrode layer, wherein the exposed portions include an exposed first electrode layer sidewall;

covering the exposed first electrode layer sidewall, wherein covering the exposed first electrode layer sidewall comprises forming a dielectric padding over the exposed first electrode layer sidewall, the dielectric padding comprising the same material as a capacitor dielectric layer to be deposited; and forming the capacitor dielectric layer of a substantially uniform thickness over both the conductive strap and the exposed portions of the first electrode layer of the composite capacitor bottom electrode, wherein forming the dielectric layer comprises depositing the dielectric layer over the bottom electrode, including over the covered first electrode layer sidewall, after covering the exposed first electrode layer sidewall.

33. The method of claim 32, wherein the dielectric layer comprises a nitride, and the dielectric padding formation comprises a rapid thermal nitridation.

34. The method of claim 33, wherein the first electrode layer comprises a silicon layer and the dielectric padding comprise silicon nitride.

35. The method of claim 34, wherein the rapid thermal nitridation comprises heating the bottom electrode to a temperature between about 800° C. and 1,100° C. in a predominantly nitrogen environment for between about 5 seconds and 60 seconds.

* * * * *

UNITED STATES PATENT AND TRADEMARK OFFICE
CERTIFICATE OF CORRECTION

PATENT NO. : 6,555,432 B2
DATED : April 29, 2003
INVENTOR(S) : Sandhu et al.

It is certified that error appears in the above-identified patent and that said Letters Patent is hereby corrected as shown below:

Column 1,
Line 52, "commoniy" should be -- commonly --

Signed and Sealed this

Fifteenth Day of June, 2004

JON W. DUDAS
*Acting Director of the United States Patent and Trademark Office*